(12) United States Patent
Nakamura et al.

(10) Patent No.: US 7,317,610 B2
(45) Date of Patent: Jan. 8, 2008

(54) SHEET-SHAPED CAPACITOR AND METHOD FOR MANUFACTURE THEREOF

(75) Inventors: Hirofumi Nakamura, Tokyo (JP); Yutaka Akimoto, Tokyo (JP); Sadamu Toita, Miyagi (JP); Takayuki Inoi, Miyagi (JP); Katsuhiro Yoshida, Miyagi (JP)

(73) Assignees: NEC Toppan Circuit Solutions, Inc., Tokyo (JP); NEC Tokin Corporation, Sendai-Shi, Miyagi (JP)

( * ) Notice: Subject to any disclaimer, the term of this patent is extended or adjusted under 35 U.S.C. 154(b) by 0 days.

(21) Appl. No.: 11/272,781

(22) Filed: Nov. 15, 2005

(65) Prior Publication Data

US 2006/0120014 A1  Jun. 8, 2006

(30) Foreign Application Priority Data

Nov. 16, 2004  (JP)  ............... 2004-331385

(51) Int. Cl.
*H01G 4/228* (2006.01)
*H01G 9/00* (2006.01)
*H01G 9/04* (2006.01)

(52) U.S. Cl. .............. 361/540; 361/532; 361/528

(58) Field of Classification Search .......... 361/523, 361/528–529, 532, 533, 540, 761, 763
See application file for complete search history.

(56) References Cited

U.S. PATENT DOCUMENTS

| | | | |
|---|---|---|---|
| 6,510,045 B2 * | 1/2003 | Mido et al. | 361/529 |
| 6,545,353 B2 | 4/2003 | Mashino | |
| 6,882,544 B2 | 4/2005 | Nakamura et al. | |
| 6,980,416 B2 * | 12/2005 | Sakaguchi et al. | 361/523 |
| 7,009,834 B2 * | 3/2006 | Arai et al. | 361/538 |
| 2002/0122287 A1 * | 9/2002 | Mido et al. | 361/529 |
| 2002/0159223 A1 * | 10/2002 | Mido et al. | 361/523 |
| 2004/0130857 A1 * | 7/2004 | Miki et al. | 361/523 |
| 2005/0047062 A1 * | 3/2005 | Mido et al. | 361/523 |

FOREIGN PATENT DOCUMENTS

| | | |
|---|---|---|
| EP | 1377141 A2 * | 1/2004 |
| JP | 08-273983 | 10/1996 |
| JP | 2738590 | 1/1998 |
| JP | 2001-320171 | 11/2001 |
| JP | 2004-31641 | 1/2004 |
| JP | 2004-165248 | 6/2004 |
| JP | 2004-221176 | 8/2004 |

OTHER PUBLICATIONS

Japanese Office Action dated Feb. 7, 2007 with a partial English translation.

* cited by examiner

*Primary Examiner*—Eric Thomas
(74) *Attorney, Agent, or Firm*—McGinn IP Law Group, PLLC

(57) ABSTRACT

A sheet-shaped capacitor for storing electrical charges of large capacities, and to assure facilitated manufacture, cost reduction and improved reliability, and a method for manufacturing the capacitor. The capacitor includes a dielectric film 12, formed on a first major surface of a metal plate 11, an electrically conductive high polymer layer 13, formed on a first major surface of the dielectric film, and an electrically conductive layer 14 formed on a first major surface of the electrically conductive high polymer layer 13, such as by copper plating. A cathode electrode 20 is led out from the electrically conductive layer 14 on the side electrically conductive high polymer layer 13.

21 Claims, 9 Drawing Sheets

SHEET-SHAPED CAPACITOR AND METHOD FOR MANUFACTURE THEREOF

FIELD OF THE INVENTION

This invention relates to a capacitor and a method for manufacture thereof. More particularly, it relates to a capacitor that may be applied with advantage to a solid electrolyte capacitor of a thin thickness, and a method for manufacture thereof.

BACKGROUND OF THE INVENTION

As a conventional printed circuit board, enclosing a capacitor in a substrate thereof, there is disclosed in Patent Document 1 (JP Patent No. 2738590) the configuration of a capacitor laminate which is composed of an organic dielectric layer sandwiched between conductor layers and which may operate as a capacitor. However, with the configuration described in this Patent Document 1, the capacitance cannot be raised beyond a limit value of several nF at most.

In a well-known manner, there are three techniques of increasing the capacitance C of a capacitor, namely
the technique of increasing the surface areas of the electrodes;
the technique of decreasing the spacing between the electrodes (that is, of reducing the thickness of the dielectric layer between the electrodes); and
the technique of increasing the dielectric constant of the dielectric layer.

Turning to the above techniques, it is practically difficult, from the perspective of product reliability, such as electrical insulating properties, and the manufacture process, to set the film thickness of the dielectric layer to 1 µm or less. It is similarly difficult to drastically increase the dielectric constant of the dielectric layer. The Patent Document 1 teaches roughening the metal surface for apparently increasing its surface area. However, with the method disclosed in the Patent Document 1, the surfaces of the electrodes, facing each other, cannot be increased, as a result of which sufficient properties cannot be achieved.

On the other hand, Patent Document 2 (JP Patent Kokai Publication No. JP-P2001-320171A) discloses a configuration comprising a dielectric layer for a capacitor of aluminum oxide, formed for covering up the surface of an aluminum substrate, and a plating layer for a capacitor electrode, formed for covering up the surface of the dielectric layer for the capacitor. The aluminum substrate, dielectric layer for a capacitor and the plating layer for a capacitor electrode make up a capacitor in a multi-layer circuit substrate, whereby the necessity of burying a chip capacitor in an inter-layer insulating film may be removed to render it possible to reduce the film thickness of the inter-layer insulating film and hence the thickness of the multi-layer circuit substrate in its entirety. However, the aluminum oxide film, formed by sintering a powdered material, is not up to coping with the demand for reduction of film thickness.

For solving the above problem, the present inventors have already proposed the configuration of a capacitor enclosed in a printed circuit board making use of a metal core of e.g. aluminum to enable storage of electrical charges of larger capacities (see Patent Document 3). FIG. 6 shows one of the configurations proposed in the above Patent Document 3. Referring to FIG. 6, for preparing this state-of-the-art capacitor, it is necessary to carry out the steps of covering the perimeter of an aluminum oxide layer 12, formed on the surface of the aluminum plate 11, with an electrically conductive high polymer layer 13, selectively forming an electrically conductive paste 15 in a cathode side electrode contact area (via-forming area), and removing the electrically conductive high polymer layer 13 and the aluminum oxide layer 12 on the anode side for exposing the surface of the aluminum plate 11, as shown in FIG. 6.

[Patent Document 1]
  JP Patent No. 2738590

[Patent Document 2]
  JP Patent Kokai Publication No. JP-P2001-320171A

[Patent Document 3]
  JP Patent Kokai Publication No. JP-P2004-31641A

SUMMARY OF THE DISCLOSURE

For realizing the storage of electrical charges of larger capacities, and simultaneously assuring facilitated manufacture, cost reduction and operational device reliability, for the capacitor proposed in the above patent Publication 3, the present inventors have conducted further eager searches, and have arrived at several novel teachings.

The present invention, completed on the basis of the above information, is aimed to provide a capacitor enabling the storage of electrical charges of larger capacities, and simultaneously assuring facilitated manufacture, cost reduction and operational device reliability, and a method for manufacture of the capacitor.

For accomplishing the above object, the invention disclosed in the present specification substantially resides in the following:

In one aspect, the present invention provides a sheet-shaped capacitor comprising a metal plate, a dielectric film formed on a first surface of the metal plate, an electrically conductive high polymer layer formed on a first surface of the dielectric film, and an electrically conductive layer, including a metal plating, formed on a first surface of the electrically conductive high polymer layer.

In another aspect, the present invention provides a sheet-shaped capacitor comprising a metal plate, a dielectric film formed on a first surface of the metal plate, an electrically conductive high polymer layer formed on a first surface of the dielectric film, and an electrically conductive layer, including an electrically conductive paste, formed on a first surface of the electrically conductive high polymer layer.

According to the present invention, a cathode electrode is led out to a first surface of the electrically conductive layer, and an anode electrode is led out from an electrically conductive layer provided on a second surface opposite to the first surface of the metal plate. Alternatively, a cathode electrode may be led out to a first surface of the electrically conductive layer, while an anode electrode is led out from an electrically conductive layer provided on the second surface opposite to the first surface of the metal plate, through a through-hole, to the same surface side as the surface where there is provided the cathode electrode. Still alternatively, the anode electrode is led out from the electrically conductive layer provided on the second surface opposite to the first surface of the metal plate. There may be provided the cathode electrode led out through a through-hole, from the electrically conductive layer provided to the first surface of the metal plate, to the same surface side as the surface where there is provided the anode electrode.

According to the present invention, preferably the metal plate is formed of aluminum and the dielectric film is formed of aluminum oxide. According to the present invention, preferably the first surface of the metal plate is roughened.

According to the present invention, preferably the electrically conductive high polymer layer is formed of at least one electrically conductive high polymer compound selected from the group of polypyrrole, polythiophene and polyaniline.

According to the present invention, preferably the electrically conductive paste includes carbon paste and, formed thereon, silver paste, copper paste and/or silver/copper paste. Or, in a configuration where the electrically conductive paste includes carbon paste and copper paste formed thereon, a copper plating layer, as the metal plating layer, may be formed on the copper paste.

In a further aspect, the present invention provides a method for manufacturing a sheet-shaped capacitor comprising a step of oxidizing a first surface of a metal plate to form a dielectric film, a step of forming an electrically conductive high polymer layer on an entire area of a first surface of the dielectric film, and a step of forming an electrically conductive layer, formed by a metal plating, on an entire surface of a first surface of the electrically conductive high polymer layer.

In a further aspect, the present invention provides a method for manufacturing a sheet-shaped capacitor comprising a step of oxidizing a first surface of a metal plate to form a dielectric film, a step of forming an electrically conductive high polymer layer on an entire area of a first surface of the dielectric film, and a step of applying electrically conductive paste on an entire area of a first surface of the electrically conductive high polymer layer.

The meritorious effects of the present invention are summarized as follows.

According to the capacitor of the present invention, in which the electrically conductive high polymer layer is formed on the entire area of the first surface of the dielectric film, obtained on oxidizing the first surface of the metal plate, and in which the electrically conductive layer is formed on the entire area of the first surface of the electrically conductive high polymer layer, the configuration is simpler than the configuration shown for example in FIG. 6, thus assuring facilitated manufacture, cost reduction and improved operational reliability of the electrical device.

PREFERRED EMBODIMENTS OF THE INVENTION

Figure 1A:
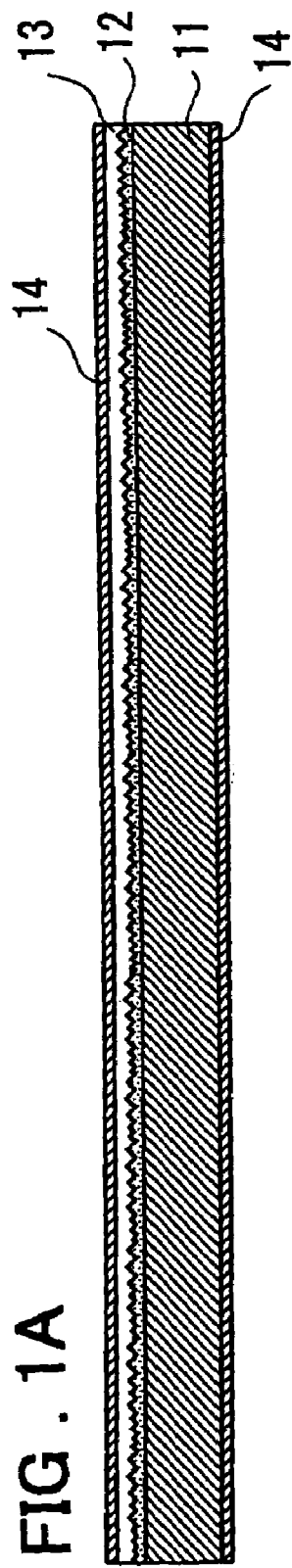
FIG. 1A shows a cross-sectional configuration of an embodiment of the present invention and FIG. 1B shows the cross-sectional configuration of another embodiment of execution.

The best mode for carrying out the present invention will now be explained. FIG. 1A depicts a cross-sectional view showing the configuration of an embodiment of the present invention. Referring to FIG. 1A, there are provided a layer of aluminum oxide 12, formed on one surface of an aluminum plate 11, forming a metal plate, an electrically conductive high polymer layer 13, formed on the aluminum oxide layer 12, and a copper plating layer 14, formed on the electrically conductive high polymer layer 13. The aluminum oxide layer 12 forms a dielectric film, and the copper plating layer 14 forms an electrically conductive layer.

A first surface (forward surface) of the foil-shaped aluminum plate 11 presents fine surface roughness by e.g. etching. With use of the aluminum plate 11, the substrate may be of needed strength as the substrate is reduced in thickness. The aluminum oxide layer 12, sometimes referred to as Al oxide layer, formed on the first surface of the aluminum plate 11, has a thickness such that a lower limit of the thickness is, e.g., hundreds of pm (picometer: 1 pm=$10^{-12}$ m) and an upper limit of the thickness is, e.g., tens of nm (nanometer). The thin film of the aluminum oxide layer 12 may be formed by a film forming technique of, for example, sputtering. The thin film of the aluminum oxide layer 12 may also be formed by oxidizing the surface of the aluminum plate 11. In the present embodiment, an oxide film, formed by the aluminum oxide layer 12, having a high dielectric constant, is formed on the aluminum plate 11, having its surface increased by roughing, such that, as a result of reduced thickness of the capacitor (separation between electrodes) and increased electrode surface, the capacitance of the capacitor is increased. A solid electrolyte layer of the electrically conductive high polymer layer 13 is formed on the entire area of the first surface of the aluminum oxide layer 12. The electrically conductive high polymer layer 13 is a layer of e.g. polypyrrole which is a polymer of pyrrole. Instead of being formed of polypyrrole, the electrically conductive high polymer layer 13 may also be formed of e.g. polythiophene or polyaniline. The copper plating layer 14 is provided on the entire area of the first surface of the electrically conductive high polymer layer 13, and a cathode electrode is suitably led out from an appropriate site of the copper plating layer 14.

On a second surface (back surface) opposite to the first surface of the aluminum plate 11, there is provided the copper plating layer 14, and an anode electrode is suitably led out from an appropriate site of the copper plating layer 14.

Figure 1B:
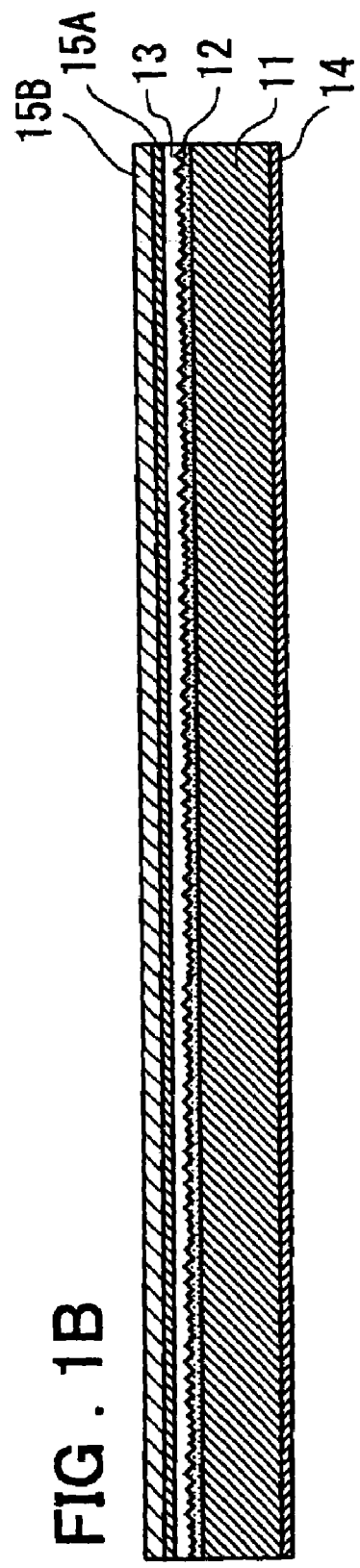

Referring to FIG. 1B, there are provided an aluminum oxide layer 12 formed on a first surface (forward surface) of the aluminum plate 11, forming a metal plate, an electrically conductive high polymer layer 13, formed on a first surface of the aluminum oxide layer 12, a carbon paste 15A, formed on a first surface of the electrically conductive high polymer layer 13, and a silver/copper paste 15B. The aluminum oxide layer 12 forms a dielectric film, whilst the carbon paste and the silver/copper paste form electrically conductive layers. The electrically conductive layer may comprise a carbon paste and a copper paste layer formed thereon. In this case, that is, when the electrically conductive layer comprises the carbon paste and the copper layer, a copper plating layer may be provided on the copper paste. The electrically conductive high polymer layer 13 is provided on the entire area of the first surface of the aluminum oxide layer 12, and the electrically conductive pastes 15A, 15B are provided on the entire area of the first surface of the electrically conductive high polymer layer 13. A cathode electrode is suitably led out from an appropriate location of the silver/copper paste 15B. On a second surface (back surface) opposite to the first surface of the aluminum plate 11, there is provided a copper plating layer 14, and an anode electrode is suitably led out from an appropriate site of the copper plating layer 14. Certain preferred embodiments of the present invention will now be explained.

EMBODIMENTS

Figure 2:
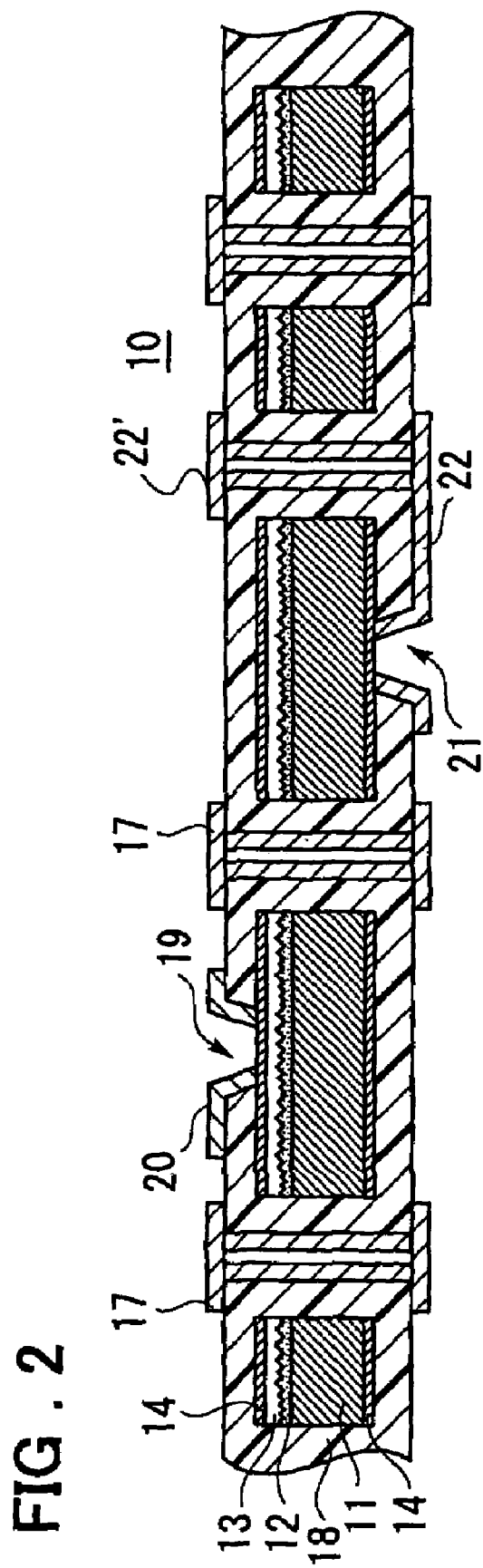
FIG. 2 shows a configuration of the embodiment of the present invention.

FIG. 2 shows the configuration of an embodiment of the present invention. Referring to FIG. 2, there are provided a film of aluminum oxide 12, formed on a first surface of an aluminum plate 11, an electrically conductive high polymer layer 13, formed on a first surface of the aluminum oxide layer 12, and a copper plating layer 14, formed on a first surface of the electrically conductive high polymer layer 13. The aluminum oxide layer 12 forms a dielectric film, and the copper plating layer 14 forms an electrically conductive layer. On a second surface of the aluminum plate 11, opposite to its first surface, there is provided another copper plating layer 14. This configuration is similar to the cross-sectional configuration of FIG. 1A. After forming bores by e.g. a drill in the assembly, in the state shown in FIG. 1A, the resulting assembly is encapsulated in insulating resin 18, such as epoxy resin. There are then formed through-holes (T/H) 17, traversing the resin 18, vias for cathode connection 19 and vias for anode connection 21, as blind vias, and copper platings 20, 22, forming electrode pads, are also formed as a cathode electrode (−) and as an anode electrode (+), respectively.

Meanwhile, in the configuration shown in FIG. 2, the anode electrode 22 is led out by the through-hole to the surface of the cathode electrode side (see electrode 22'). This electrode 22' may, however, be omitted.

A typical example of the manufacture method of the present embodiment will now be explained with reference to FIGS. 3A to 5.

Figure 3A:
FIGS. 3A, 3B and 3C illustrate the manufacturing method of the embodiment of the present invention, step-by-step.

Referring to FIG. 3A, an aluminum plate 11, presenting surface roughness on its one surface, is oxidized to form an aluminum oxide layer 12 to a film thickness of, for example, several hundreds of pm to several tens of nm. An oxide film, forming a dielectric film, is formed on the aluminum plate 11, having its surface roughened by roughening treatment, thus increasing the capacitance.

Figure 3B:

Referring to FIG. 3B, a polypyrrole film, as an electrically conductive high polymer layer 13, is formed to a film thickness of e.g. 10 to 50 μm on an entire area of the first surface of the electrically conductive high polymer layer 13.

Figure 3C:
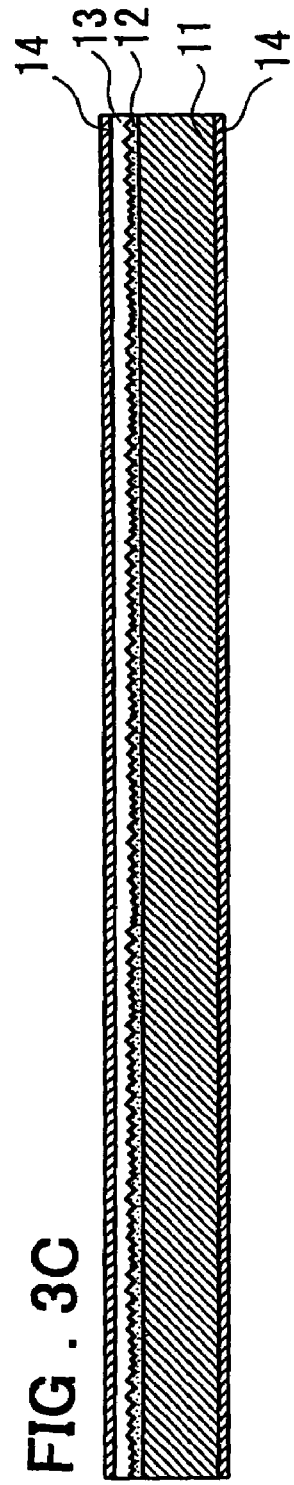

Referring to FIG. 3C, a copper plating layer 14 is then formed on an entire area of the first surface of the electrically conductive high polymer layer 13 and on an entire area of the second surface opposite to the first surface of the aluminum plate 11. A catalyst is supplied to the first surface of the electrically conductive high polymer layer 13 and copper is precipitated by e.g. electroless copper plating. The copper plating layer 14 is of a thickness roughly of, e.g., 5 to 10 and odd μm. The copper plating layer 14 on the second surface of the aluminum plate 11 is also of the same order of thickness.

As the electrically conductive member on the surface of the electrically conductive high polymer layer 13, the electrically conductive paste may be provided in two layers, namely a carbon paste and a copper/silver paste. The film thickness of the carbon paste may, for example, be on the order of several μm, while that of the silver/copper paste is on the order of tens of μm. The electrically conductive paste may be comprised of carbon paste and silver/copper paste provided thereon. A copper plating layer, for example, may be formed on this copper paste.

Figure 4A:
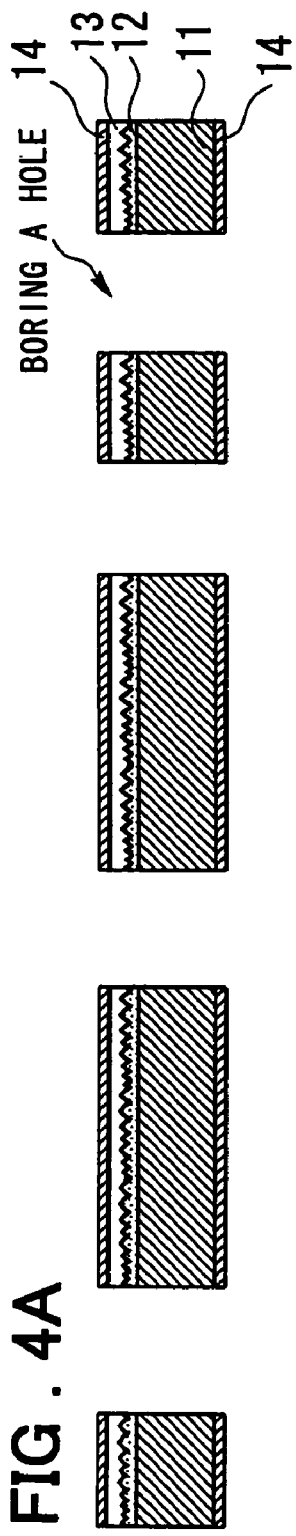
FIGS. 4A, 4B and 4C, continuing to FIGS. 3A to 3C, illustrate the manufacturing method the embodiment of the present invention, step-by-step.

Referring now to FIG. 4A, bores are formed in an assembly in the state shown in FIG. 3C, using e.g. a drill.

Figure 4B:
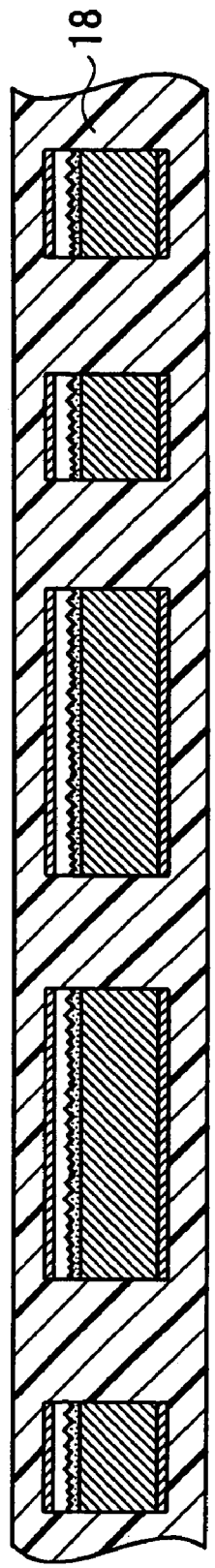

Referring now to FIG. 4B, an assembly in the state shown in FIG. 4A is encapsulated in its entirety, from both sides, in insulating resin 18, such as epoxy resin.

Figure 4C:
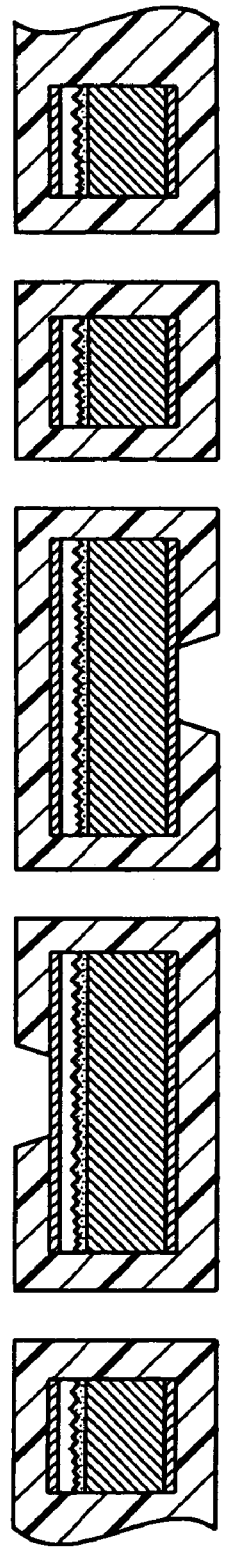

Referring now to FIG. 4C, through-holes are bored through the insulating resin 18 of the assembly shown in FIG. 4B and bores are formed by spot facing in via forming regions of the cathode and the anode, using a laser beam, for exposing the copper plating layers of the cathode and the anode. A resist for plating is then provided, and copper plating is applied to a copper plating area in the through-hole and to the via-forming regions of the cathode and the anode, to produce a sheet-shaped capacitor shown in FIG. 2.

Figure 5:
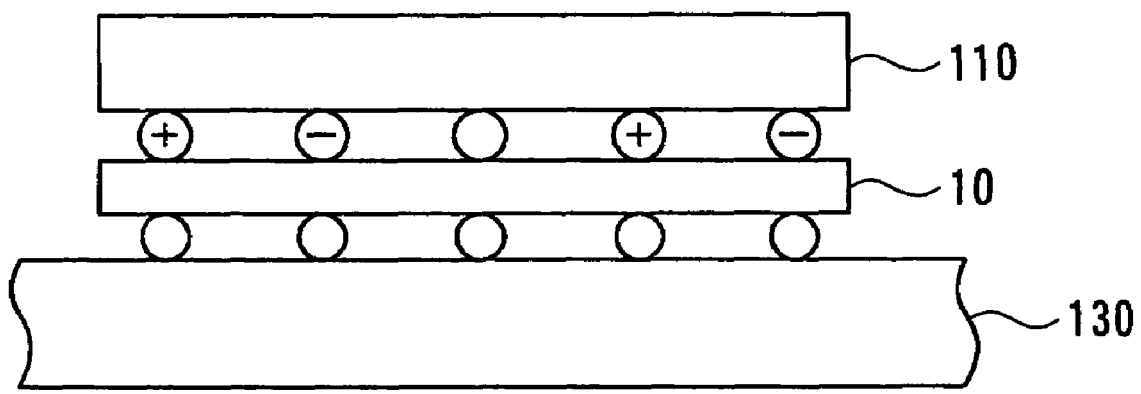
FIG. 5 shows another configuration of the embodiment of the present invention.
Figure 6:
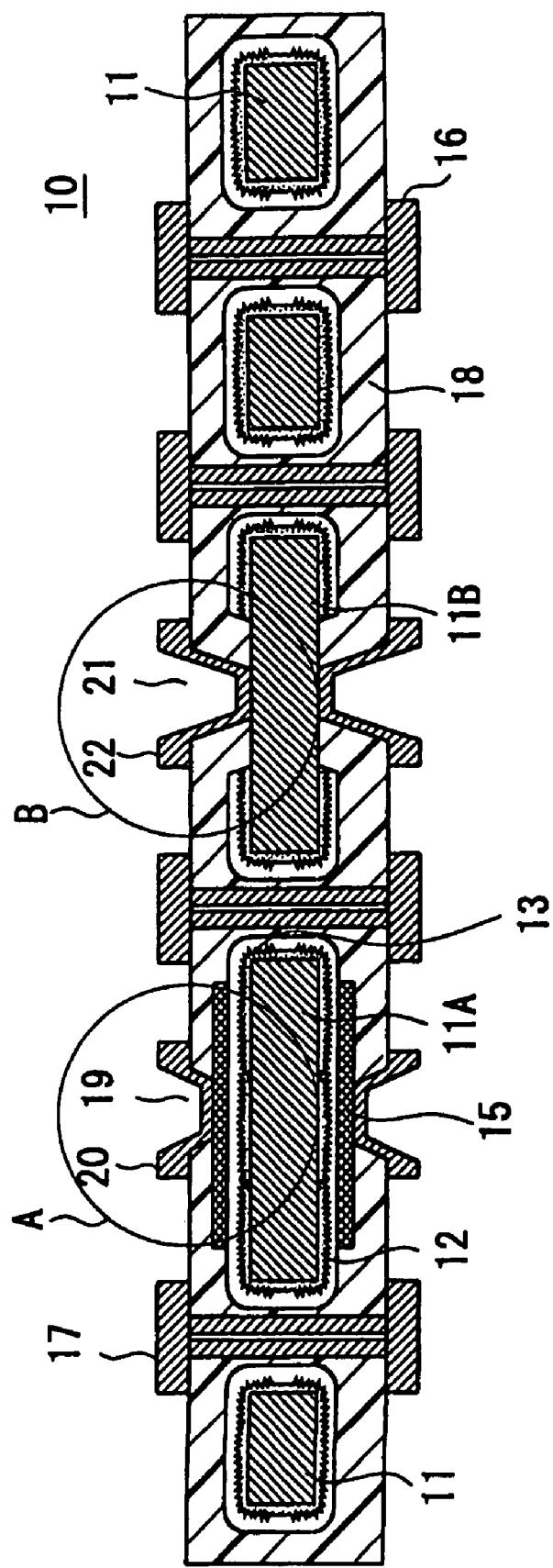
FIG. 6 shows the configuration of Patent Document 3.

FIG. 5 shows a case where the sheet-shaped capacitor 10 of the present embodiment has been mounted as a path capacitor for an LSI chip 110. An anode (+) and a cathode (−) of the sheet-shaped capacitor 10 are connected to power supply lines (VCC and GND) of the chip 110 mounted on a circuit substrate 130, such as a motherboard. With the present embodiment, the sheet-shaped capacitor 10, substantially coextensive as an area of the chip 110, may be mounted between the circuit substrate 130 and the chip 110, while signal pins of the chip 110 may be led out via through-holes to the circuit substrate 130. With the present embodiment, storage of a large capacity charge on the order of several μF to one hundred μF may be achieved as an area of the lower surface of the chip is used efficiently to realize floor space saving. It is of course possible to construct a chip size package in which the capacitor of the present invention is incorporated in an interposer and a bare chip is connected to the interposer and encapsulated in resin.

Figure 7:
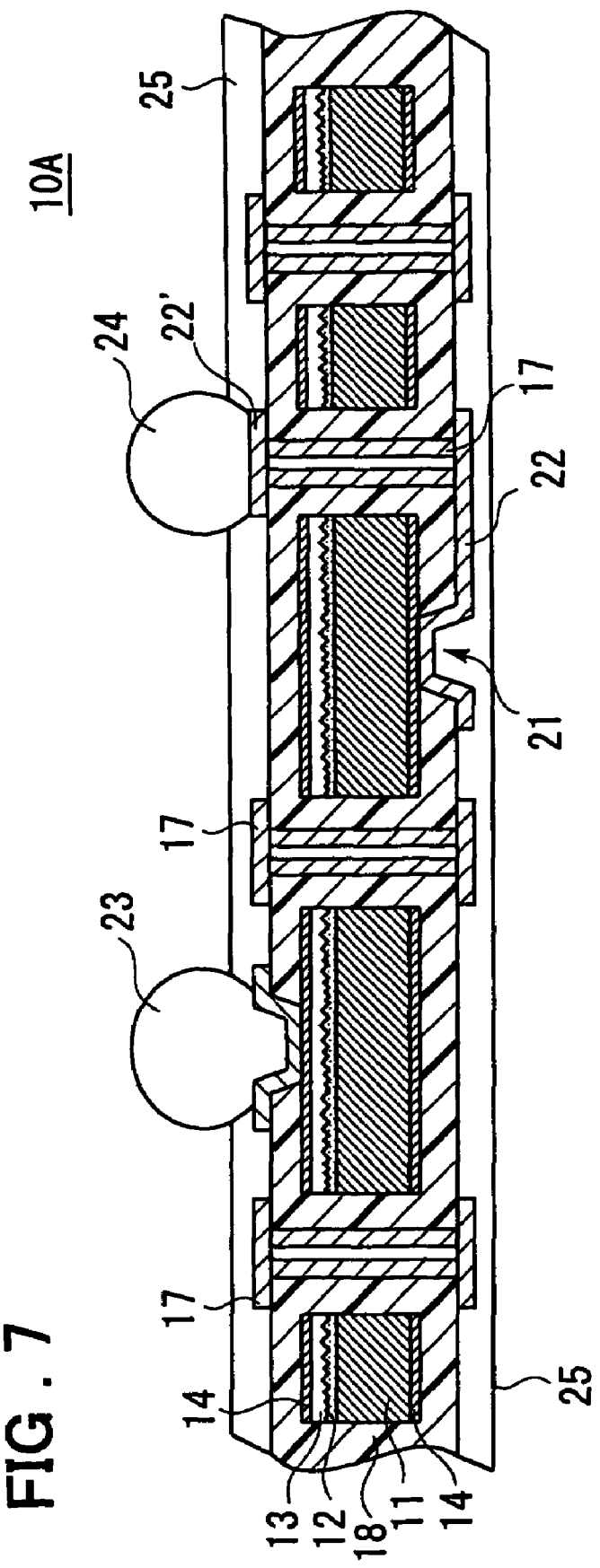
FIG. 7 shows the configuration of a modification of the present invention.

FIG. 7 shows the configuration of a modification of the present invention. In the present embodiment, cathode and anode electrodes are arranged on the same plane, while bumps, such as solder bumps, are provided to the electrode pads to form a BGA (ball grid array terminal) for use as BGA capacitor. Referring more specifically to FIG. 7, a solder bump 23 of a cathode electrode and a solder bump 24 of an anode electrode are provided to the same surface of a sheet-shaped capacitor 10A. That is, referring to FIG. 7, an anode 22 of the sheet-shaped capacitor 10A is led out by a through-hole 17 to the surface of the sheet-shaped capacitor where there is provided the cathode electrode, and the solder bump 24 is formed on the electrode pad 22', as shown in FIG. 7. A solder resist 25 is provided to each surface of the sheet-shaped capacitor 10A.

Figure 8:
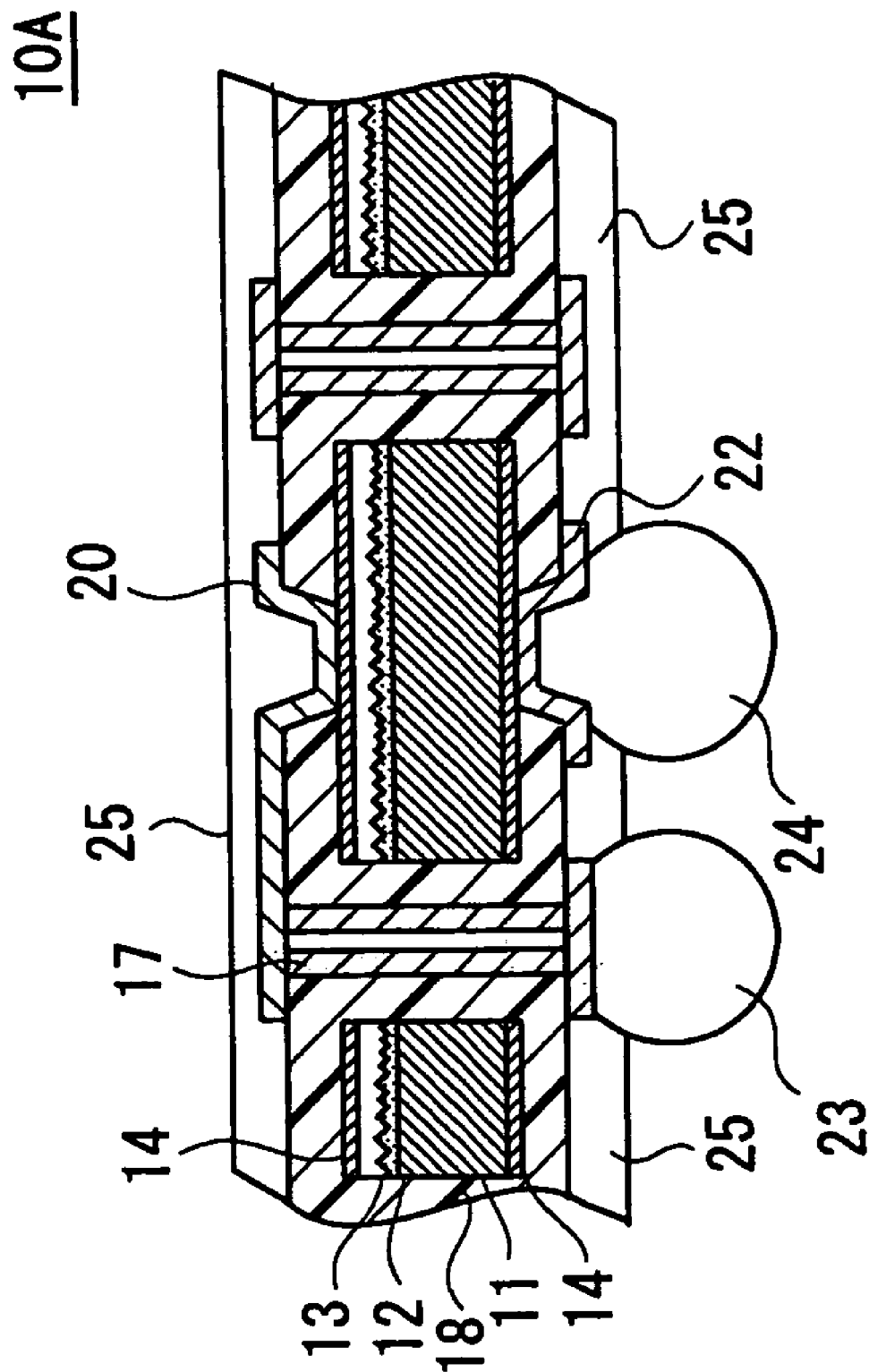
FIG. 8 shows the configuration of another modification of the present invention.

FIG. 8 shows a further modification of the present invention. In the present modification, the cathode electrode and the anode electrode are formed on the same surface to form a BGA (ball grid array) terminal. However, in the present modification, unlike the modification of FIG. 7, the cathode 20 is led out through the through-hole 17 to the anode electrode side, while the solder bump 23 of the cathode electrode is mounted flush with the solder bump 24 of the anode electrode, as shown in FIG. 8. Meanwhile, the reference numerals 25 in FIG. 8 denotes solder resist.

Figure 9:
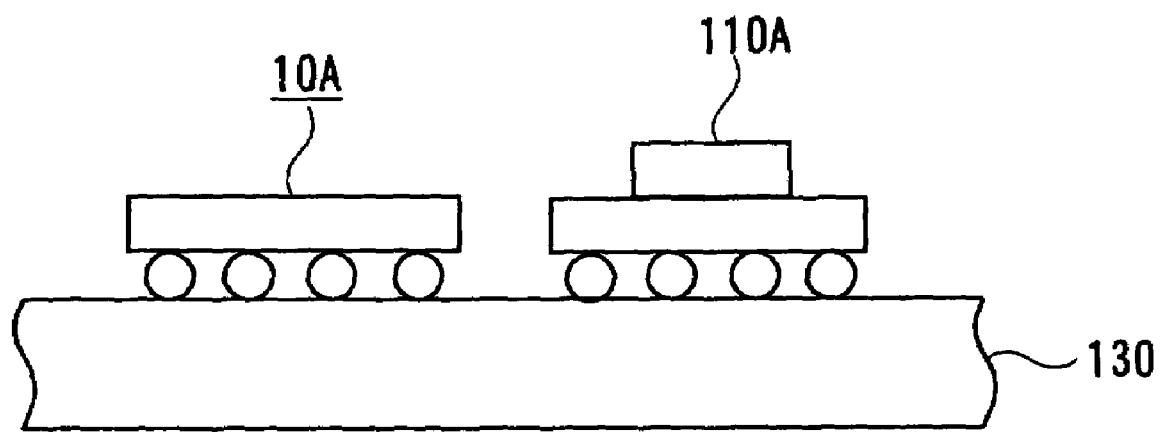
FIG. 9 shows a configuration of a further modification of the present invention.

FIG. 9 shows the state in which the sheet-shaped capacitors of the embodiments of FIGS. 7 and 8 (sheet-shaped capacitors provided with BGA terminals) are mounted on a circuit substrate 130, such as a motherboard. Meanwhile, an LSI chip 110A also includes a BGA terminal.

Although certain preferred embodiments of the present invention have been explained in the foregoing, it is to be noted that the present invention is not limited to these embodiments and that various changes or corrections that may occur to those skilled art within the scope of the present invention may naturally be encompassed by the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A sheet-shaped capacitor comprising:
   a metal plate having a first surface and an opposed second surface;
   a dielectric film formed on said first surface of said metal plate;
   an electrically conductive high polymer layer formed on a first surface of said dielectric film;
   a first electrically conductive layer formed on a first surface of said electrically conductive high polymer layer; and
   a second electrically conductive layer formed on said second surface of said metal plate,
   wherein a cathode electrode is led out to the first surface of said first electrically conductive layer, and
   wherein an anode electrode is led out from said second electrically conductive layer provided on said second surface opposite to said first surface of said metal plate to the same surface side as said surface where there is provided said cathode electrode.

2. The sheet-shaped capacitor as defined in claim 1, wherein at least one of said electrically conductive layers comprises a metal plating layer.

3. The sheet-shaped capacitor as defined in claim 2 wherein said metal plating comprises copper plating.

4. The sheet-shaped capacitor as defined in claim 2, wherein said second electrically conductive layer comprises a metal plating layer plated on said second surface of said metal plate.

5. The sheet-shaped capacitor as defined in claim 1, wherein at least one of said electrically conductive layers comprises an electrically conductive paste.

6. The sheet-shaped capacitor as defined in claim 5 wherein said electrically conductive paste includes carbon paste and, formed thereon, at least one paste selected from the group consisting of silver paste, copper paste and silver/copper paste.

7. The sheet-shaped capacitor as defined in claim 5, wherein said electrically conductive paste includes carbon paste, a copper paste formed on said carbon paste, and a copper plating layer formed on said copper paste.

8. The sheet-shaped capacitor as defined in claim 1 wherein a cathode electrode is led out to a first surface of said first electrically conductive layer, and wherein
   an anode electrode is led out from said second electrically conductive layer provided on said second surface opposite to said first surface of said metal plate.

9. The sheet-shaped capacitor as defined in claim 1, wherein anode electrode is led out from said second electrically conductive layer provided on said second surface opposite to said first surface of said metal plate, through a through-hole, to the same surface side as said surface where there is provided said cathode electrode.

10. The sheet-shaped capacitor as defined in claim 1 wherein an anode electrode is led out from said second electrically conductive layer provided on the second surface opposite to the first surface of said metal plate; and
    there is provided a cathode electrode led out through a through-hole, from said first electrically conductive layer provided to said first surface of said metal plate, to the same surface side as the surface where there is provided said anode electrode.

11. The sheet-shaped capacitor as defined in claim 10 wherein said anode electrode and said cathode electrode form a ball grid array (BGA) terminal.

12. The sheet-shaped capacitor as defined in claim 1, wherein said anode electrode and said cathode electrode form a ball grid array (BGA) terminal.

13. The sheet-shaped capacitor as defined in claim 1 wherein said metal plate is formed of aluminum and wherein said dielectric film is formed of aluminum oxide.

14. The sheet-shaped capacitor as defined in claim 1 wherein said first surface of said metal plate is roughened.

15. The sheet-shaped capacitor as defined in claim 1 wherein said electrically conductive high polymer layer is formed of at least one electrically conductive high polymer compound selected from the group consisting of polypyrrole, polythiophene and polyaniline.

16. The sheet-shaped capacitor as defined in claim 1, wherein said first electrically conductive layer is formed on an entire area of said first surface of said metal plate.

17. The sheet-shaped capacitor as defined in claim 1, wherein said second electrically conductive layer is formed on an entire area of said second surface of said metal plate.

18. The sheet-shaped capacitor as defined in claim 1, further comprising bores formed through said metal plate, said dielectric film, said electrically conductive high polymer layer, and said first and second electrically conductive layers.

19. The sheet-shaped capacitor as defined in claim 18, further comprising an encapsulant contacting edges of said metal plate, said dielectric film, said electrically conductive high polymer layer, and said first and second electrically conductive layers exposed in said bores.

20. The sheet-shaped capacitor as defined in claim 19, further comprising blind connection vias provided through said encapsulant for connection to the first and second electrically conductive layers.

21. A sheet-shaped capacitor comprising:
    a metal plate having a first surface and an opposed second surface;
    a dielectric film formed on said first surface of said metal plate;
    an electrically conductive high polymer layer formed on a first surface of said dielectric film;
    a first electrically conductive layer formed on a first surface of said electrically conductive high polymer layer;
    a second electrically conductive layer formed on said second surface of said metal plate;
    bores formed through said metal plate, said dielectric film, said electrically conductive high polymer layer, and said first and second electrically conductive layers; and
    an encapsulant contacting edges of said metal plate, said dielectric film, said electrically conductive high polymer layer, and said first and second electrically conductive layers exposed in said bores.

* * * * *